(12) United States Patent
Nakazawa et al.

(10) Patent No.: US 6,282,069 B1
(45) Date of Patent: Aug. 28, 2001

(54) MAGNETORESISTIVE ELEMENT HAVING A FIRST ANTIFERROMAGNETIC LAYER CONTACTING A PINNED MAGNETIC LAYER AND A SECOND ANTIFERROMAGNETIC LAYER CONTACTING A FREE MAGNETIC LAYER

(75) Inventors: Yukie Nakazawa, Niigata-ken; Masamichi Saito, Niigata; Naoya Hasegawa; Akihiro Makino, both of Niigata-ken, all of (JP)

(73) Assignee: Alps Electric Co., Ltd., Tokyo (JP)

(*) Notice: Subject to any disclaimer, the term of this patent is extended or adjusted under 35 U.S.C. 154(b) by 0 days.

(21) Appl. No.: 09/062,027

(22) Filed: Apr. 17, 1998

(30) Foreign Application Priority Data

Apr. 17, 1997 (JP) .................................................. 9-100274

(51) Int. Cl.[7] .................................................. G11B 5/127
(52) U.S. Cl. .................................................. 360/324.2
(58) Field of Search .................... 360/324.11, 324.12, 360/324, 324.1, 324.2

(56) References Cited

U.S. PATENT DOCUMENTS

| | | | |
|---|---|---|---|
| 5,576,915 | * 11/1996 | Akiyama et al. | 360/113 |
| 5,909,345 | * 6/1999 | Kawawake et al. | 360/113 |
| 5,971,400 | * 6/1999 | Fujikata et al. | 338/32 R |
| 6,040,961 | * 3/2000 | Gill | 360/113 |

\* cited by examiner

*Primary Examiner*—David Davis
(74) *Attorney, Agent, or Firm*—Brinks Hofer Gilson & Lione

(57) ABSTRACT

A second antiferromagnetic layer formed on a free magnetic layer has a blocking temperature lower than that of a first antiferromagnetic layer. The exchange anisotropic magnetic field between the free magnetic layer and the second antiferromagnetic layer is smaller than the exchange anisotropic magnetic field between the first antiferromagnetic layer and the pinned magnetic layer. By applying an annealing treatment utilizing the blocking temperature difference between the first and second antiferromagnetic layers, the magnetization direction and the strength of the pinned magnetic layer and the free magnetic layer can be controlled appropriately.

7 Claims, 2 Drawing Sheets

MAGNETORESISTIVE ELEMENT HAVING A FIRST ANTIFERROMAGNETIC LAYER CONTACTING A PINNED MAGNETIC LAYER AND A SECOND ANTIFERROMAGNETIC LAYER CONTACTING A FREE MAGNETIC LAYER

BACKGROUND OF THE INVENTION

1. Field of the Invention

The present invention relates to a spin-valve type magnetoresistive head with the electric resistance changeable by the relationship between the magnetization direction of a pinned magnetic layer and the magnetization direction of a free magnetic layer affected by the external magnetic field, in particular, to a spin-valve type magnetoresistive element capable of appropriately controlling the magnetization of a free magnetic layer without the need of providing a hard bias layer.

2. Description of the Related Art

FIG. 3 is a cross-sectional view showing a conventional configuration of a spin-valve type magnetoresistive element or a spin-valve type magnetoresistive head for detecting a recording magnetic field from a recording medium such as a hard disk.

As shown in the figure, an antiferromagnetic layer 1, a pinned magnetic layer 2, a non-magnetic electrically conductive layer 3, and a free magnetic layer 4 are formed, with hard bias layers 5, 5, provided at both ends thereof.

Conventionally, in general, the antiferromagnetic layer 1 comprises an Fe—Mn (iron-manganese) alloy film or an Ni—Mn (nickel-manganese) alloy film. The pinned magnetic layer 2 and the free magnetic layer 4 comprise an Fe—Ni (iron-nickel) alloy film. The non-magnetic electrically conductive layer 3 comprises a Cu (copper) film. The hard bias layers 5, 5, comprise a Co—Pt (cobalt-platinum) alloy film. Numerals 6, 7 represent a base layer and a protection layer made from a non-magnetic material such as Ta (tantalum).

As shown in the figure, the antiferromagnetic layer 1 and the pinned magnetic layer 2 are formed adjacent to each other. The pinned magnetic layer 2 is in a single domain state in the Y direction by the exchange anisotropic magnetic field by the exchange coupling at the interface with the antiferromagnetic layer 1 so that the magnetization direction is fixed to the Y direction. The exchange anisotropic magnetic field is generated at the interface between the antiferromagnetic layer 1 and the pinned magnetic layer 2 by applying an annealing treatment (thermal treatment) while applying a magnetic field in the Y direction.

By the influence from the hard bias layers 5, 5, magnetized in the X direction, the magnetization direction of the free magnetic layer 4 is aligned in the X direction.

An antiferromagnetic material has the inherent blocking temperature. By exceeding the temperature, the exchange anisotropic magnetic field at the interface between the antiferromagnetic layer and the magnetic layer is vanished.

Therefore, the annealing treatment for putting the pinned magnetic layer 2 in a single domain state by the exchange anisotropic magnetic field at the interface between the antiferromagnetic layer 1 and the pinned magnetic layer 2 needs to be conducted at a temperature lower than the blocking temperature of the antiferromagnetic material comprising the antiferromagnetic layer 1. If a thermal treatment is applied at the blocking temperature or higher, the exchange anisotropic magnetic field is weakened (or vanished) so that the pinned magnetic layer 2 cannot be put in a single domain state in the Y direction to generate a problem of a large noise of the detection output.

The blocking temperature of an Fe—Mn alloy film conventionally used as the antiferromagnetic layer 1 is about 150° C., and the blocking temperature of an Ni—Mn alloy film is about 400° C.

The spin-valve type magnetoresistive element shown in FIG. 3 can be produced by forming 6 layers from the lower layer 6 to the protection layer 7, abrading out the side part of the 6 layers by an etching process such as an ion milling so as to have an inclined surface with an angle θ, and forming the hard bias layers 5, 5 at both ends of the 6 layers.

In the spin-valve type magnetoresistive element, a stationary current (detection current) is provided from electrically conductive layers 8, 8 formed on the hard bias layers 5, 5 to the pinned magnetic layer 2, the non-magnetic electrically conductive layer 3, and the free magnetic layer 4. The running direction of a recording medium such as a hard disk is the Z direction. If the current is provided in the direction of the leakage magnetic field Y from the recording medium, the magnetization of the free magnetic layer 4 changes from the X direction to the Y direction. The electric resistance is changed by the relationship between the change of the magnetization direction in the free magnetic layer 4 and the pinned magnetization direction in the pinned magnetic layer 2. The leakage magnetic field from the recording medium can be detected by the voltage change based on the electric resistance value change.

Since the spin-valve type magnetoresistive element shown in FIG. 2 has the hard bias layers 5, 5, at both sides of the 6 layers from the base layer 6 to the protection layer 7, the below-mentioned problems are involved.

The angle θ of the inclined surface formed in the side part of the 6 layers from the base layer 6 to the protection layer 7 should be in an optional range. If the inclined surface is formed with an angle θ outside the range, the leakage magnetic field from the hard bias layers 5, 5 in the X direction cannot be transmitted to the free magnetic layer 4 well so that it involves a problem in that the magnetization direction of the free magnetic layer 4 cannot be aligned completely in the X direction. Unless the magnetization direction of the free magnetic layer 4 is completely aligned in a single magnetic domain in the X direction, reproduction characteristics are affected such as generation of a Barkhausen noise.

Furthermore, in the spin-valve type magnetoresistive element shown in FIG. 3, the hard bias layers 5, 5 formed at both sides of the free magnetic layer 4 has a thin film thickness so that a sufficient bias magnetic field cannot be applied to the free magnetic layer 4 in the X direction. Therefore, it is disadvantageous in that the magnetization direction of the free magnetic layer 4 cannot be stable in the X direction, and thus a Barkhausen noise can be easily generated.

Moreover, the hard bias layers 5, 5 formed at both sides of the pinned magnetic layer 2 have a comparatively thick film thickness so that the pinned magnetic layer 2 receives a comparatively strong bias magnetic field from the hard bias layers 5, 5 in the X direction.

As heretofore mentioned, the magnetization of the pinned magnetic field 2 is fixed in the Y direction by the exchange anisotropic magnetic field at the interface with the antiferromagnetic layer 1, however, it may involve a problem in that the magnetization can be affected to change by the bias magnetic field from the hard bias layers 5, 5 in the X direction so that the leakage magnetic field from the recording medium cannot be detected well unless the magnetization of the pinned magnetic layer 2 is fixed firmly in the Y direction.

SUMMARY OF THE INVENTION

In order to solve the above-mentioned problems, an object of the present invention is to provide a spin-valve type magnetoresistive element comprising an antiferromagnetic layer (hereinafter referred to as a second antiferromagnetic layer) contacting with a free magnetic layer in place of a hard bias layer for aligning the magnetization direction of the free magnetic layer so as to align the magnetization direction of the free magnetic layer orthogonal to the magnetization direction of a pinned magnetic layer.

Another object of the present invention is to provide a production method of a spin-valve type magnetoresistive element capable of appropriately controlling the magnetization direction and the strength of a pinned magnetic layer and a free magnetic layer by selecting an antiferromagnetic material such that the blocking temperature of the second antiferromagnetic layer is lower than the blocking temperature of an ferromagnetic layer contacting with the pinned magnetic layer (hereinafter referred to as a first antiferromagnetic layer) and the exchange anisotropic magnetic field between the second antiferromagnetic layer and the free magnetic layer is smaller than the exchange anisotropic magnetic field between the first ferromagnetic layer and the pinned magnetic layer, and applying the annealing treatment utilizing the blocking temperature difference between the first ferromagnetic layer and the second ferromagnetic layer.

A spin-valve type magnetoresistive element of the present invention comprises a free magnetic layer and a pinned magnetic layer via a non-magnetic electrically conductive layer, a first antiferromagnetic layer contacting with the pinned magnetic layer for fixing the magnetization direction of the pinned magnetic layer by the exchange anisotropic magnetic field, and a second ferromagnetic layer contacting with the free magnetic layer for aligning the magnetization of the free magnetic layer orthogonal to the magnetization direction of the pinned magnetic layer by the exchange anisotropic magnetic field, wherein the first antiferromagnetic layer has a blocking temperature higher than that of the second antiferromagnetic layer, and the exchange anisotropic magnetic field between the first antiferromagnetic layer and the pinned magnetic layer is larger than the exchange anisotropic magnetic field between the second antiferromagnetic layer and the free magnetic layer.

According to the present invention, it is preferable that the blocking temperature of the first antiferromagnetic layer is 300° C. or more, and the blocking temperature of the second antiferromagnetic layer is 100° C. to 280° C.

It is more preferable that the exchange anisotropic magnetic field between the first antiferromagnetic layer and the pinned magnetic layer is 200 Oe (oersted) or more, and the exchange anisotropic magnetic field between the second antiferromagnetic layer and the free magnetic layer is 2 to 200 Oe.

It is further preferable that the first antiferromagnetic layer is made from any of a Pt—Mn (platinum-manganese) alloy film, a Pt—Mn-X alloy (X represents at least one selected from the group consisting of Ni, Pd, Rh, Ir, Cr, and Co), or an Ni—Mn (nickel-manganese) alloy film, and the second antiferromagnetic layer is made from any of an Ir—Mn (iridium-manganese) alloy film, an Rh—Mn (rhodium-manganese) alloy film, an Fe—Mn (iron-manganese) alloy film, or NiO (nickel oxide).

The above-mentioned Pt—Mn alloy film and Pt—Mn-X alloy film (X represents at least one selected from the group consisting of Ni, Pd, Rh, Ir, Cr, and Co) have a high blocking temperature of 300° C. or more. Although it may depend on the film thickness of the pinned magnetic layer, in general, the exchange anisotropic magnetic field generated by the contact of these antiferromagnetic materials and the pinned magnetic layer is extremely large so that the magnetization of the pinned magnetic layer can firmly be in a single domain state. A large exchange anisotropic magnetic field can be obtained also by laminating these films above or below the pinned magnetic layer. Therefore, the Pt—Mn alloy film and Pt—Mn-X alloy film (X represents at least one selected from the group consisting of Ni, Pd, Rh, Ir, Cr, and Co) can be an appropriate material for the first antiferromagnetic layer.

When the first antiferromagnetic layer is made from a Pt—Mn alloy film, it is preferable that the composition ratio of the Pt—Mn alloy film is 44 to 51 atomic % of Pt and 49 to 56 atomic % of Mn. The exchange anisotropic magnetic field generated at the interface between the Pt—Mn alloy film with the composition ratio and the pinned magnetic layer is extremely large.

When the second antiferromagnetic layer is laminated above the free magnetic layer, the above-mentioned Ir—Mn alloy film, Rh—Mn alloy film, and Fe—Mn alloy film has a low blocking temperature of 280° C. or less. Although it may partly depend on the film thickness of the free magnetic layer, the exchange anisotropic magnetic field generated at the interface between the antiferromagnetic materials and the free magnetic material is smaller with respect to the above-mentioned first antiferromagnetic material, therefore, the magnetization direction of the free magnetic layer can be aligned orthogonal to the magnetization direction of the pinned magnetic layer in a degree the magnetization can be reversed by an external magnetic field. When these materials are formed below the free magnetic layer, the exchange anisotropic magnetic field is extremely small compared with the case where these materials are formed above the free magnetic layer. Therefore, it is difficult to align the magnetization direction of the free magnetic layer. Accordingly, an Ir—Mn alloy film, an Rh—Mn alloy film, and an Fe—Mn alloy film are appropriate for the antiferromagnetic material when it is formed above the free magnetic layer. When the second antiferromagnetic layer is laminated below the free magnetic layer, the above-mentioned NiO film has a low blocking temperature of 280° C. or less. Although it may partly depend on the film thickness of the free magnetic layer, the exchange anisotropic magnetic field generated at the interface between the antiferromagnetic material and the free magnetic material is small, therefore, the magnetization direction of the free magnetic layer can be aligned orthogonal to the magnetization direction of the pinned magnetic layer in a degree the magnetization can be reversed by an external magnetic field. When the NiO is formed above the free magnetic layer, the exchange anisotropic magnetic field is extremely small compared with the case where these materials are formed below the free magnetic layer. Therefore, it is difficult to align the magnetization direction of the free magnetic layer. Accordingly, NiO is appropriate for the second antiferromagnetic material when it is formed below the free magnetic layer.

A first aspect of a production method of a spin-valve type magnetoresistive element of the present invention comprises the steps of: laminating a first antiferromagnetic layer, a pinned magnetic layer, a non-magnetic electrically conductive layer, a free magnetic layer and a second antiferromagnetic layer, applying a thermal treatment at a temperature of ordering the crystal structure of the first antiferromagnetic layer or a temperature lower than the blocking temperature of the second antiferromagnetic layer while applying a magnetic field in the leakage magnetic field direction of a recording medium, and applying a thermal treatment at a temperature lower than the blocking temperature of the first antiferromagnetic layer but higher than the blocking temperature of the second ferromagnetic layer while applying a magnetic field in the direction orthogonal to the leakage magnetic field of the recording medium.

As mentioned above, in the present invention, the first antiferromagnetic layer and the second ferromagnetic layer need to satisfy the following conditions:

(1) The blocking temperature of the first antiferromagnetic layer is higher than the blocking temperature of the second ferromagnetic layer.

(2) The exchange anisotropic magnetic field between the first antiferromagnetic layer and the pinned magnetic layer is larger than the exchange anisotropic magnetic field between the second antiferromagnetic layer and the free magnetic layer.

An antiferromagnetic material satisfying the conditions are used as the first and second antiferromagnetic materials.

After laminating a first antiferromagnetic layer, a pinned magnetic layer, a non-magnetic electrically conductive layer, a free magnetic layer and a second antiferromagnetic layer, an annealing treatment is applied at a temperature of ordering the crystal structure of the first antiferromagnetic layer or a temperature lower than the blocking temperature of the second antiferromagnetic layer while applying a magnetic field in the leakage magnetic field direction of a recording medium as a first step. According to the step, the magnetization of both pinned magnetic layer and free magnetic layer can be aligned in the leakage magnetic field direction of the recording medium.

Then, as a second step, an annealing treatment is applied at a temperature lower than the blocking temperature of the first antiferromagnetic layer but higher than the blocking temperature of the second ferromagnetic layer while applying a magnetic field in the direction orthogonal to the leakage magnetic field of the recording medium. Since the annealing treatment is conducted at a temperature higher than the blocking temperature of the second antiferromagnetic layer, the exchange anisotropic magnetic field at the interface between the free magnetic layer and the second antiferromagnetic layer can be small (or vanished), the free magnetic layer in the single domain state in the direction the same as the magnetization of the pinned magnetic layer becomes a multi-domain state so as to have magnetic moments oriented in different directions in each magnetic domain. After achieving the state, by gradually lowering the temperature so as to have the annealing temperature lower than the blocking temperature of the second antiferromagnetic layer, the exchange anisotropic magnetic field is generated again at the interface between the second antiferromagnetic layer and the free magnetic layer and thus the magnetization direction of the free magnetic layer is aligned in the direction orthogonal to the magnetization direction of the pinned magnetic layer.

As mentioned above, since the exchange anisotropic magnetic field generated at the interface between the first antiferromagnetic layer and the pinned magnetic layer is large, the magnetization of the pinned magnetic layer can be fixed firmly in the leakage magnetization direction of the recording medium. Further, since the exchange anisotropic magnetic field generated at the interface between the second antiferromagnetic layer and the free magnetic layer is small, the magnetization of the free magnetic layer can be aligned such that the magnetization can be reversed in the direction orthogonal to the magnetization direction of the pinned magnetic layer.

Accordingly since the magnetization of the free magnetic layer can be appropriately controlled in the present invention without the need of providing a hard bias layer as in the conventional embodiment, the multi-layer film comprising from the base layer 6 to the protection layer 7 needs not be formed in a trapezoid shape and thus the production process can be simplified.

Further, since the hard bias layer is not provided, the conventional problem of an unstable magnetization of the pinned magnetic layer caused by the effect from the leakage magnetic field of the hard bias layer to the pinned magnetic layer can be solved.

A second aspect of a production method of a spin-valve type magnetoresistive element of the present invention comprises the steps of: laminating a second antiferromagnetic layer, a free magnetic layer, a non-magnetic electrically conductive layer, a pinned magnetic layer and a first antiferromagnetic layer, applying a thermal treatment at a temperature of ordering the crystal structure of the first anti ferromagnetic layer or a temperature lower than the blocking temperature of the second antiferromagnetic layer while applying a magnetic field in the leakage magnetic field direction of a recording medium, and applying a thermal treatment at a temperature lower than the blocking temperature of the first antiferromagnetic layer but higher than the blocking temperature of the second ferromagnetic layer while applying a magnetic field in the direction orthogonal to the leakage magnetic field of the recording medium. The function and effects the same as the above-mentioned first aspect can be achieved.

DESCRIPTION OF THE PREFERRED EMBODIMENT

Figure 1:
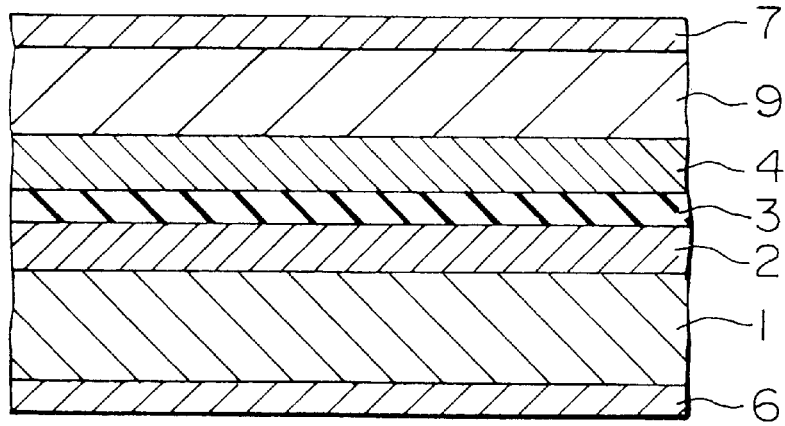
FIG. 1 is a cross-sectional view showing the configuration of a spin-valve type magnetoresistive element of the present invention.

FIG. 1 is a cross-sectional view showing the configuration of a first spin-valve type magnetoresistive element of the present invention.

The spin-valve type magnetoresistive element is to be laminated on a reading head portion of a spin-valve type magnetic head. By the spin-valve type magnetoresistive element, the leakage magnetic field from a recording medium such as a hard disk can be detected.

The magnetoresistive element is to be mounted to the trailing side end part of a floating type slider provided in a hard disk device. The moving direction of a recording medium such as a hard disk is the Z direction, and the direction of the leakage magnetic field from the recording medium is the Y direction.

A base layer 6 made from a non-magnetic material such as Ta (tantalum) is provided in the lowermost part of FIG. 1.

An antiferromagnetic layer (first antiferromagnetic layer) 1 and a pinned magnetic layer 2 are laminated on the base layer 6. A non-magnetic electrically conductive layer 3 with a low electric resistance such as Cu (copper), a free magnetic layer 4, and an antiferromagnetic layer (second antiferromagnetic layer) 9 are successively formed on the pinned magnetic layer 2. A protection layer 7 such as Ta (tantalum) is formed on the antiferromagnetic layer 9. The pinned magnetic layer 2 and the free magnetic layer 4 can be made from a Co—Fe (cobalt-iron) alloy, an Ni—Fe (nickel-iron) alloy, Co (cobalt), a Co—Ni (cobalt-nickel) alloy, or an Fe—Co-Ni (iron-cobalt-nickel) alloy.

In the present invention, the first antiferromagnetic layer 1 and the second antiferromagnetic layer 9 are made from a material satisfying the following conditions.

(1) The blocking temperature of the first antiferromagnetic layer 1 is higher than the blocking temperature of the second ferromagnetic layer 9.

(2) The exchange anisotropic magnetic field between the first antiferromagnetic layer 1 and the pinned magnetic layer 2 is larger than the exchange anisotropic magnetic field between the second antiferromagnetic layer 9 and the free magnetic layer 4.

It is particularly preferable that the blocking temperature of the first antiferromagnetic layer 1 is 300° C. or more, and the blocking temperature of the second antiferromagnetic layer 9 is 100° C. to 280° C.

It is also preferable that the exchange anisotropic magnetic field between the first antiferromagnetic layer 1 and the pinned magnetic layer 2 is 200 Oe (oersted) or more, and the exchange anisotropic magnetic field between the second antiferromagnetic layer 9 and the free magnetic layer 4 is 2 to 200 Oe.

Examples of preferable antiferromagnetic materials for the first antiferromagnetic layer 1 satisfying the above-mentioned conditions include a Pt—Mn (platinum-manganese) alloy film, an Ni—Mn (nickel-manganese) alloy film, and a Pt—Mn-X alloy film (X represents at least one selected from the group consisting of Ni, Pd, Rh, Ru, Ir, Cr, and Co). Examples of preferable antiferromagnetic materials for the second antiferromagnetic layer 9 include an Ir—Mn (iridium-manganese) alloyfilm, an Rh—Mn (rhodium-managense) alloyfilm, and an Fe—Mn (iron-manganese) alloy film.

A Pt—Mn alloy film to be used as the first antiferromagnetic layer 1 has a blocking temperature of about 380° C., an Ni—Mn alloy film about 400° C., the Pt—Mn-X alloy film (X represents at least one selected from the group consisting of Ni, Pd, Rh, Ru, Ir, Cr, and Co) 300° C. to 380° C., and a Pd—Pt—Mn alloy film about 300° C. so that all of them are an antiferromagnetic material having a blocking temperature of 300° C. or more. An Ir—Mn alloy film to be used as the second antiferromagnetic layer 9 laminated on the free magnetic layer 4 has a blocking temperature of about 240° C., an Rh—Mn alloy film about 200° C., and an Fe—Mn alloy film about 150° C. so that all of them are an antiferromagnetic material having a blocking temperature from 100° C. to 280° C.

Concerning the exchange anisotropic magnetic field, not only the material of an antiferromagnetic layer but also the film thickness of a magnetic layer contacting with the antiferromagnetic layer are related. It is known that in general, with a thinner magnetic layer film thickness, the exchange anisotropic magnetic field becomes larger.

Therefore, byproviding the first antiferromagnetic layer 1 with an antiferromagnetic material selected from the group consisting of a Pt—Mn alloy film, an Ni—Mn alloy film, and a Pt—Mn-X alloy film (X represents at least one selected from the group consisting of Ni, Pd, Rh, Ru, Ir, Cr, and Co), and appropriately adjusting the film thickness of the pinned magnetic layer 2, the exchange anisotropic magnetic field at the interface between the antiferromagnetic layer 1 and the pinned magnetic layer 2 can be larger than 200 Oe. The exchange anisotropic magnetic field can be provided when these antiferromagnetic materials are laminated above or below the pinned magnetic layer 2.

When the first antiferromagnetic layer 1 is formed with a Pt—Mn alloy film, the composition ratio of the Pt—Mn alloy film is preferably 44 to 51 atomic % of Pt and 49 to 56 atomic % of Mn, more preferably 46 to 49 atomic % of Pt and 51 to 54 atomic % of Mn. With the composition ratio, the exchange anisotropic magnetic field generated at the interface between the first antiferromagnetic layer 1 and the pinned magnetic layer 2 of the Pt—Mn alloy film can be extremely large.

Furthermore, by providing the second antiferromagnetic layer 9 to be laminated above the free magnetic layer 4 with an antiferromagnetic material selected from the group consisting of an Ir—Mn alloy film, an Rh—Mn alloy film, and a Fe—Mn alloy film, and appropriately adjusting the film thickness of the free magnetic layer 4, the exchange anisotropic magnetic field at the interface between the second antiferromagnetic layer 9 and the free magnetic layer 4 can be small from 2 to 200 Oe.

Figure 2:
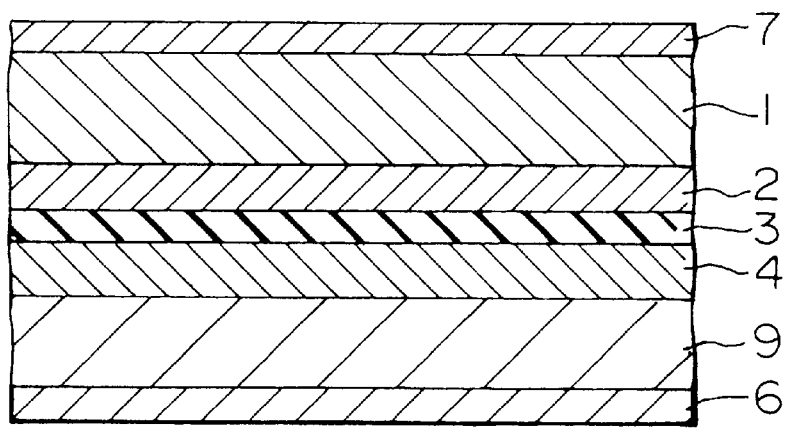
FIG. 2 is a cross-sectional view showing the configuration of a spin-valve type magnetoresistive element of the present invention.
Figure 3:
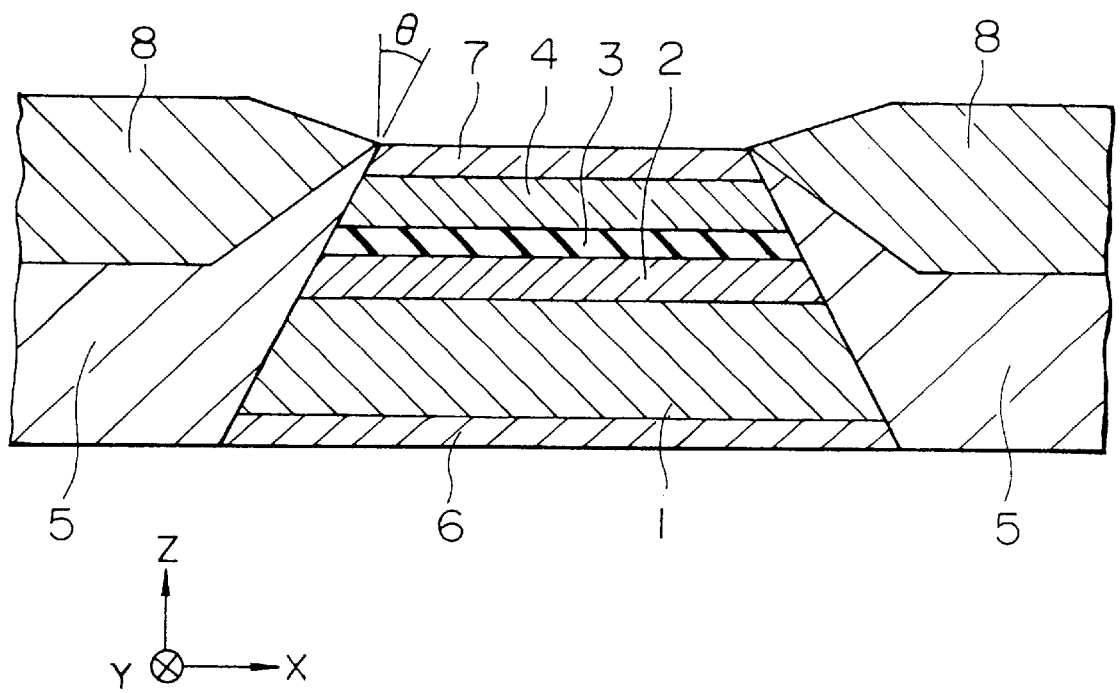
FIG. 3 is a cross-sectional view showing the configuration of a conventional spin-valve type magnetoresistive element.

FIG. 2 is a cross-sectional view showing the configuration of a second spin-valve type magnetoresistive element of the present invention.

A base layer 6 made from a non-magnetic material such as Ta (tantalum) is provided in the lowermost part of FIG. 2. An antiferromagnetic layer (second antiferromagnetic layer) 9 and a pinned magnetic layer 2 are laminated on the base layer 6. A non-magnetic electrically conductive layer 3 with a low electric resistance such as Cu (copper), a free magnetic layer 4, and an antiferromagnetic layer (first antiferromagnetic layer) 1 are successively formed on the free magnetic layer 4. A protection layer 7 such as Ta (tantalum) is formed on the antiferromagnetic layer 1. The pinned magnetic layer 2 and the free magnetic layer 4 can be made from a Co—Fe (cobalt-iron) alloy, an Ni—Fe (nickel-iron) alloy, Co (cobalt), an Fe—Co—Ni (iron-cobalt-nickel) alloy, or a Co—Ni (cobalt-nickel) alloy.

In the present invention, the first antiferromagnetic layer 1 and the second antiferromagnetic layer 9 are made from a material satisfying the following conditions.

(1) The blocking temperature of the first antiferromagnetic layer 1 is higher than the blocking temperature of the second ferromagnetic layer 9.

(2) The exchange anisotropic magnetic field between the first antiferromagnetic layer 1 and the pinned magnetic layer 2 is larger than the exchange anisotropic magnetic field between the second antiferromagnetic layer 9 and the free magnetic layer 4.

It is particularly preferable that the blocking temperature of the first antiferromagnetic layer 1 is 300° C. or more, and the blocking temperature of the second antiferromagnetic layer 9 is 100° C. to 280° C.

It is also preferable that the exchange anisotropic magnetic field between the first antiferromagnetic layer 1 and the pinned magnetic layer 2 is 200 Oe (oersted) or more, and the exchange anisotropic magnetic field between the second antiferromagnetic layer 9 and the free magnetic layer 4 is 2 to 200 Oe.

Examples of preferable antiferromagnetic materials for the first antiferromagnetic layer 1 satisfying the above-mentioned conditions include a Pt—Mn (platinum-manganese) alloy film, an Ni—Mn (nickel-manganese) alloy film, and a Pt—Mn-X alloy film (X represents at least one selected from the group consisting of Ni, Pd, Rh, Ru, Ir, Cr, and Co). Examples of preferable antiferromagnetic materials for the second antiferromagnetic layer 9 include a CoO (cobalt-oxide) film.

A Pt—Mn alloy film to be used as the first antiferromagnetic layer 1 has a blocking temperature of about 380° C., an Ni—Mn alloy film about 400° C., the Pt—Mn-X alloy film (X represents at least one selected from the group consisting of Ni, Pd, Rh, Ru, Ir, Cr, and Co) 300° C. to 380° C., and a Pd—Pt—Mn alloy film about 300° C. so that all of them are an antiferromagnetic material having a blocking temperature of 300° C. or more. A CoO film to be used as the second antiferromagnetic layer 9 laminated on the free magnetic layer 4 has a blocking temperature of about 260° C. so that it is an antiferromagnetic material having a blocking temperature from 100° C. to 280° C.

Concerning the exchange anisotropic magnetic field, not only the material of an antiferromagnetic layer but also the film thickness of a magnetic layer contacting with the antiferromagnetic layer are related. It is known that in general, with a thinner magnetic layer film thickness, the exchange anisotropic magnetic field becomes larger.

Therefore, by providing the first antiferromagnetic layer 1 with an antiferromagnetic material selected from the group consisting of a Pt—Mn alloy film, an Ni—Mn alloy film, and a Pt—Mn-X alloy film (X represents at least one selected from the group consisting of Ni, Pd, Rh, Ru, Ir, Cr, and Co), and appropriately adjusting the film thickness of the pinned magnetic layer 2, the exchange anisotropic magnetic field at the interface between the antiferromagnetic layer 1 and the pinned magnetic layer 2 can be larger than 200 Oe. The exchange anisotropic magnetic field can be provided when these antiferromagnetic materials are laminated above or below the pinned magnetic layer 2.

When the first antiferromagnetic layer 1 is formed with a Pt—Mn alloy film, the composition ratio of the Pt—Mn alloy film is preferably 44 to 51 atomic % of Pt and 49 to 56 atomic % of Mn, more preferably 46 to 49 atomic % of Pt and 51 to 54 atomic % of Mn. With the composition ratio, the exchange anisotropic magnetic field generated at the interface between the first antiferromagnetic layer 1 and the pinned magnetic layer 2 of the Pt—Mn alloy film can be extremely large.

Furthermore, by providing the second antiferromagnetic layer 9 to be laminated below the free magnetic layer 4 with a CoO film as the antiferromagnetic material, and appropriately adjusting the film thickness of the free magnetic layer 4, the exchange anisotropic magnetic field at the interface between the second antiferromagnetic layer 9 and the free magnetic layer 4 can be small from 2 to 200 Oe.

Hereinafter the method of appropriately adjusting the magnetization direction and strength of the pinned magnetic layer 2 and the free magnetic layer 4, utilizing the blocking temperature difference between the first antiferromagnetic layer 1 and the second antiferromagnetic layer 9 and the strength difference between the exchange anisotropic magnetic field between the first antiferromagnetic layer and the pinned magnetic layer and the exchange anisotropic magnetic field between the second antiferromagnetic layer and the free magnetic layer will be explained.

As shown in FIG. 1, a first production method of the present invention comprises a first step of an annealing treatment at a temperature of ordering the crystal structure of the first antiferromagnetic layer 1 (for example, with the antiferromagnetic layer 1 made from a Pt—Mn alloy film, the Pt and Mn atoms are arranged alternately), or a temperature lower than the blocking temperature of the second antiferromagnetic layer while applying a magnetic field in the Y direction of the figure after laminating an antiferromagnetic layer 1, a pinned magnetic layer 2, a non-magnetic electrically conductive layer 3, a free magnetic layer 4 and an antiferromagnetic layer 9. The duration of the annealing treatment in the first step is about a few hours when the crystal structure is ordered, or a few minutes to a few tens of minutes when the annealing is conducted at a temperature lower than the blocking temperature of the second antiferromagnetic layer.

According to the step, the magnetization of the pinned magnetic layer 2 and the free magnetic layer 4 can be put into a single domain state in the Y direction in the figure. As mentioned above, since the exchange anisotropic magnetic field generated at the interface between the first antiferromagnetic layer 1 and the pinned magnetic layer 2 is large, the magnetization of the pinned magnetic layer 2 can be firmly fixed in the Y direction in the figure.

As a second step, an annealing treatment is conducted at a temperature lower than the blocking temperature of the first antiferromagnetic layer 1 but higher than the blocking temperature of the second antiferromagnetic layer 9 while applying a magnetic field in the X direction of the figure. The duration of the annealing treatment in the second step is from a few minutes to a few tens of minutes.

Since a temperature lower than the blocking temperature of the first antiferromagnetic layer 1 but higher than the blocking temperature of the second antiferromagnetic layer 9 is used in the annealing treatment in the second step, the blocking temperature of the first antiferromagnetic layer 1 needs to be higher than the blocking temperature of the second antiferromagnetic layer 9 as in this invention. For example, when a Pt—Mn alloy film having the blocking temperature of about 380° C. is used as the first antiferromagnetic layer 1 and an Ir—Mn alloy film having the blocking temperature of about 240° C. is used as the second antiferromagnetic layer 9, the annealing treatment in the second step can be conducted at a temperature higher than 240° C. but lower than 380° C.

Since the annealing treatment temperature in the second step is higher than the blocking temperature of the second antiferromagnetic layer 9, the exchange anisotropic magnetic field generated at the interface between the second antiferromagnetic layer 9 and the free magnetic layer 4 can be small (or vanished), and the magnetization in the single domain state in the Y direction of the figure in the first step can be in the multi-domain state with the magnetic moments in each magnetic domain oriented to various directions. At the time, since the annealing treatment temperature is lower than the blocking temperature of the first antiferromagnetic layer 1, the annealing treatment time is very short, and the magnetization of the pinned magnetic layer 2 is firmly fixed in the Y direction of the figure, the magnetization of the pinned magnetic layer 2 remains fixed in the Y direction.

By gradually lowering the annealing temperature from the state until the annealing temperature becomes lower than the blocking temperature of the second antiferromagnetic layer 9, the exchange bond can be generated again at the interface between the second antiferromagnetic layer 9 and the free magnetic layer, and the magnetization of the free magnetic layer 4 can be put into the single domain state in the magnetic field application direction in the second step (X direction in the figure).

However, since the exchange anisotropic magnetic field at the interface between the second antiferromagnetic layer 9 and the free magnetic layer 4 is small (at least smaller than the exchange anisotropic magnetic field at the interface between the first antiferromagnetic layer 1 and the pinned magnetic layer 2), the magnetization of the free magnetic layer 4 is in the single domain state in a degree of generating a magnetization reversal with respect to the leakage magnetic field of the recording medium (Y direction in the figure).

As mentioned above, in the present invention where the second antiferromagnetic layer 9 is formed above the free magnetic layer 4, the first antiferromagnetic layer 1 and the second ferromagnetic layer 9 to be formed below the pinned magnetic layer 2 are made from a material satisfying the following conditions:

(1) The blocking temperature of the first antiferromagnetic layer 1 is higher than the blocking temperature of the second ferromagnetic layer 9.

(2) The exchange anisotropic magnetic field between the first antiferromagnetic layer 1 and the pinned magnetic layer 2 is larger than the exchange anisotropic magnetic field between the second antiferromagnetic layer 9 and the free magnetic layer 4.

Since the annealing treatment is applied utilizing the blocking temperature difference between the first antiferromagnetic layer 1 and the second antiferromagnetic layer 9 in the present invention, the magnetization of the pinned magnetic layer 2 can be fixed in the Y direction in the figure and the magnetization of the free magnetic layer 4 can be in the single domain state in a degree of generating a magnetization reversal with respect to the leakage magnetic field of the recording medium (Y direction in the figure).

Accordingly, unlike the conventional embodiment, since a hard bias layer needs not be provided, and a step of etching both sides of a multi-layer film from the base layer 6 to the protection layer 7 to form an inclined surface can be omitted, the production process can be simplified.

Further, since the hard bias layer is not required, a conventional problem of the unstable magnetization direction of the pinned magnetic layer by the influence of the leakage magnetic field from the hard bias layer on the pinned magnetic layer can be solved.

In the spin-valve type magnetoresistive element heretofore explained in detail, when a constant current (detection current) is applied from the electrically conductive layer (not illustrated) to the pinned magnetic layer 2, the non-magnetic electrically conductive layer 3 and the free magnetic layer 4, and a magnetic field is applied from the recording medium in the Y direction, the magnetization direction of the free magnetic layer 4 can be changed from the X direction to the Y direction. At the time, electrons moving from one layer to the other between the free magnetic layer 4 and the pinned magnetic layer 2 generate scattering at the interface between the non-magnetic electrically conductive layer 3 and the pinned layer 2, or at the interface between the non-magnetic electrically conductive layer 2 and the free magnetic layer 4 so as to change the electric resistance. Accordingly, the constant current is changed so as to obtain a detection output.

As shown in FIG. 2, a second production method of the present invention comprises a first step of an annealing treatment at a temperature of ordering the crystal structure of the first antiferromagnetic layer 1 (for example, with the antiferromagnetic layer 1 made from a Pt—Mn alloy film, the Pt and Mn atoms are arranged alternately), or a temperature lower than the blocking temperature of the second antiferromagnetic layer while applying a magnetic field in the Y direction of the figure after laminating an antiferromagnetic layer 9, a free magnetic layer 4, a non-magnetic electrically conductive layer 3, a pinned magnetic layer 2 and an antiferromagnetic layer 1. The duration of the annealing treatment in the first step is about a few hours when the crystal structure is ordered, or a few minutes to a few tens of minutes when the annealing is conducted at a temperature lower than the blocking temperature of the second antiferromagnetic layer.

According to the step, the magnetization of the pinned magnetic layer 2 and the free magnetic layer 4 can be put into a single domain state in the Y direction in the figure. As mentioned above, since the exchange anisotropic magnetic field generated at the interface between the first antiferromagnetic layer 1 and the pinned magnetic layer 2 is large, the magnetization of the pinned magnetic layer 2 can be firmly fixed in the Y direction in the figure.

As a second step, an annealing treatment is conducted at a temperature lower than the blocking temperature of the first antiferromagnatic layer 1 but higher than the blocking temperature of the second antiferromagnetic layer 9 while applying a magnetic field in the X direction of the figure. The duration of the annealing treatment in the second step is from a few minutes to a few tens of minutes.

Since a temperature lower than the blocking temperature of the first antiferromagnetic layer 1 but higher than the blocking temperature of the second antiferromagnetic layer 9 is used in the annealing treatment in the second step, the blocking temperature of the first antiferromagnetic layer 1 needs to be higher than the blocking temperature of the second antiferromagnetic layer 9 as in this invention. For example, when a Pt—Mn alloy film having the blocking temperature of about 380° C. is used as the first antiferromagnetic layer 1 and a CoO film having the blocking temperature of about 260° C. is used as the second antiferromagnetic layer 9, the annealing treatment in the second step can be conducted at a temperature higher than 260° C. but lower than 380° C.

Since the annealing treatment temperature in the second step is higher than the blocking temperature of the second antiferromagnetic layer 9, the exchange anisotropic magnetic field generated at the interface between the second antiferromagnetic layer 9 and the free magnetic layer 4 can be small (or vanished), and the magnetization in the single domain state in the Y direction of the figure in the first step can be in the multi-domain state with the magnetic moments in each magnetic domain oriented to various directions. At the time, since the annealing treatment temperature is lower than the blocking temperature of the first antiferromagnetic layer 1, the annealing treatment time is very short, and the magnetization of the pinned magnetic layer 2 is firmly fixed in the Y direction of the figure, the magnetization of the pinned magnetic layer 2 remains fixed in the Y direction.

By gradually lowering the annealing temperature from the state until the annealing temperature becomes lower than the blocking temperature of the second antiferromagnetic layer 9, the exchange bond can be generated again at the interface between the second antiferromagnetic layer 9 and the free magnetic layer, and the magnetization of the free magnetic layer 4 can be put into the single domain state in the magnetic field application direction in the second step (X direction in the figure).

However, since the exchange anisotropic magnetic field at the interface between the second antiferromagnetic layer 9 and the free magnetic layer 4 is small (at least smaller than the exchange anisotropic magnetic field at the interface between the first antiferromagnetic layer 1and the pinned magnetic layer 2), the magnetization of the free magnetic layer 4 is in the single domain state in a degree of generating a magnetization reversal with respect to the leakage magnetic field of the recording medium (Y direction in the figure).

As mentioned above, in the present invention where the second antiferromagnetic layer 9 is formed above the free magnetic layer 4, the first antiferromagnetic layer 1 and the second ferromagnetic layer 9 to be formed below the pinned magnetic layer 2 are made from a material satisfying the following conditions:

(1) The blocking temperature of the first antiferromagnetic layer 1 is higher than the blocking temperature of the second ferromagnetic layer 9.

(2) The exchange anisotropic magnetic field between the first antiferromagnetic layer 1 and the pinned magnetic layer 2 is larger than the exchange anisotropic magnetic field between the second antiferromagnetic layer 9 and the free magnetic layer 4.

Since the annealing treatment is applied utilizing the blocking temperature difference between the first antiferromagnetic layer 1 and the second antiferromagnetic layer 9 in the present invention, the magnetization of the pinned magnetic layer 2 can be fixed in the Y direction in the figure and the magnetization of the free magnetic layer 4 can be in the single domain state in a degree of generating a magnetization reversal with respect to the leakage magnetic field of the recording medium (Y direction in the figure).

Accordingly, unlike the conventional embodiment, since a hard bias layer needs not be provided, and a step of etching both sides of a multi-layer film from the base layer 6 to the protection layer 7 to form an inclined surface can be omitted, the production process can be simplified.

Further, since the hard bias layer is not required, a conventional problem of the unstable magnetization direction of the pinned magnetic layer by the influence of the leakage magnetic field from the hard bias layer on the pinned magnetic layer can be solved.

In the spin-valve type magnetoresistive element heretofore explained in detail, when a constant current (detection current) is applied from the electrically conductive layer (not illustrated) to the pinned magnetic layer 2, the non-magnetic electrically conductive layer 3 and the free magnetic layer 4, and a magnetic field is applied from the recording medium in the Y direction, the magnetization direction of the free magnetic layer 4 can be changed from the X direction to they direction. At the time, electrons moving from one layer to the other between the free magnetic layer 4 and the pinned magnetic layer 2 generate scattering at the interface between the non-magnetic electrically conductive layer 3 and the pinned layer 2, or at the interface between the non-magnetic electrically conductive layer 2 and the free magnetic layer 4 so as to change the electric resistance. Accordingly, the constant current is changed so as to obtain a detection output.

EXAMPLE 1

In the present invention, the 7 layers from the base layer 6 to the protection layer 7 shown in FIG. 1 were provided with the materials and the film thickness mentioned below, and the annealing treatment was applied with the below-mentioned conditions. The exchange anisotropic magnetic field obtained at the interface between the first antiferromagnetic layer 1 and the pinned magnetic layer 2 and the exchange anisotropic magnetic field obtained at the interface between the second antiferromagnetic layer 9 and the free magnetic layer 4 were measured with VSM comprising a vacuum heater mechanism. Experiment results are shown below.

The base layer 6 having a 50 Å film thickness was formed with Ta (tantalum). The first antiferromagnetic layer 1 having a 300 Å film thickness was formed with a Pt—Mn alloy film (blocking temperature about 380° C).The pinned magnetic layer 2 having a 30 Å film thickness was formed with a Co—Fe alloy film. The non-magnetic electrically conductive layer 3 having a 28 Å thickness was formed with Cu (copper). The free magnetic layer 4 having a 50 Å film thickness was formed with a Co—fe alloy film . The second antiferromagnetic layer 9 having a 100 Å film thickness was formed with an Ir—Mn alloy film (blocking temperature about 240° C). The protection layer 7 having a 50 Å film thickness was formed with Ta (tantalum). To the multi-layer film accordingly formed, an annealing treatment was applied at 230° C. for 4 hours while applying a 2000 Oe (oersted) magnetic field in the Y direction shown in FIG. 1.

While applying a 2000 Oe magnetic field in the X direction in the figure, an annealing treatment was applied at 250° C. for 10 minutes. Then, the annealing treatment temperature was gradually lowered.

The exchange anisotropic magnetic field was measured with a VSM (vibrating sample magnetometer) with a vacuum heater mechanism. The exchange anisotropic magnetic field at the interface between the first antiferromagnetic layer 1 and the pinned magnetic layer 2 was an extremely large value of about 700 Oe. On the other hand, the exchange anisotropic magnetic field at the interface between the second antiferromagnetic layer 9 and the free magnetic layer 4 was an extremely small value of about 60 Oe.

From the above-mentioned experiment results, the pinned magnetic layer 2 can be assumed to be firmly in a single domain state in the Y direction in the figure, and the free magnetic layer 4 weakly in a single domain state in the X direction in the figure.

EXAMPLE 2

In the present invention, the 7 layers from the base layer 6 to the protection layer 7 shown in FIG. 2 were provided with the materials and the film thickness mentioned below, and the annealing treatment was applied with the below-mentioned conditions. The exchange anisotropic magnetic field obtained at the interface between the first antiferromagnetic layer 1 and the pinned magnetic layer 2 and the exchange anisotropic magnetic field obtained at the interface between the second antiferromagnetic layer 9 and the free magnetic layer 4 were measured with VSM comprising a vacuum heater mechanism. Experiment results are shown below.

The base layer 6 having a 50 Å film thickness was formed with Ta (tantalum). The second antiferromagnetic layer 9 having a 100 Å film thickness was formed with a CoO film (blocking temperature about 240° C.). The protection layer 7 having a 50 Å film thickness was formed with Ta (tantalum). The free magnetic layer 4 having a 50 Å film thickness was formed with a Co—Fe alloy film. The non-magnetic electrically conductive layer 3 having a 28 Å thickness was formed with Cu (copper). The pinned magnetic layer 2 having a 30 Å film thickness was formed with a Co—Fe alloy film. The first antiferromagnetic layer 1 having a 300 Å film thickness was formed with a Pt—Mn alloy film (blocking temperature about 380° C.). To the multi-layer film accordingly formed, an annealing treatment was applied at 230° C. for 4 hours while applying a 2000 Oe (oersted) magnetic field in the Y direction shown in FIG. 1.

While applying a 2000 Oe magnetic field in the X direction in the figure, an annealing treatment was applied at 250° C. for 10 minutes. Then, the annealing treatment temperature was gradually lowered.

The exchange anisotropic magnetic field was measured with a VSM (vibrating sample magnetometer) with a vacuum heater mechanism. The exchange anisotropic magnetic field at the interface between the first antiferromagnetic layer 1 and the pinned magnetic layer 2 was an extremely large value of about 700 Oe. On the other hand, the exchange anisotropic magnetic field at the interface between the second antiferromagnetic layer 9 and the free magnetic layer 4 was an extremely small value of about 60 Oe.

From the above-mentioned experiment results, the pinned magnetic layer 2 can be assumed to be firmly in a single domain state in the Y direction in the figure, and the free magnetic layer 4 weakly in a single domain state in the X direction in the figure.

According to the present invention heretofore explained in detail, a second antiferromagnetic layer is formed on the free magnetic layer of a spin-valve type magnetoresistive element where at least a first antiferromagnetic layer, a pinned magnetic layer, a non-magnetic electrically conductive layer and a free magnetic layer are laminated so as to appropriately control the magnetization of the free magnetic layer.

Conditions necessary for the first antiferromagnetic layer and the second ferromagnetic layer include:

(1) The blocking temperature of the first antiferromagnetic layer is higher than the blocking temperature of the second ferromagnetic layer.

(2) The exchange anisotropic magnetic field between the first antiferromagnetic layer and the pinned magnetic layer is larger than the exchange anisotropic magnetic field between the second antiferromagnetic layer and the free magnetic layer.

In the present invention, an annealing treatment is conducted at a temperature of ordering the crystal structure of the first antiferromagnetic layer or a temperature lower than the blocking temperature of the second antiferromagnetic layer while applying a magnetic field in the leakage magnetic field direction of a recording medium, and an annealing treatment is conducted at a temperature lower than the blocking temperature of the first antiferromagnetic layer but higher than the blocking temperature of the second ferromagnetic layer while applying a magnetic field in the direction orthogonal to the leakage magnetic field of the recording medium, utilizing the blocking temperature difference between the first antiferromagnetic layer and the second antiferromagnetic layer.

According to the annealing treatments, the magnetization of the pinned magnetic layer can be firmly fixed in the leakage magnetic field direction of the recording medium, and the magnetization of the free magnetic layer can be in the direction orthogonal to the magnetization of the pinned magnetic layer in a degree the magnetization can be reversed by an external magnetic field.

According to the present invention, since the free magnetic layer can be appropriately controlled without the need of forming a hard bias layer as in the conventional embodiment, the step of etching the multi-layer film in a trapezoidal shape is not required so that the production process can be simplified. Further, the conventional problem of the unstable magnetization of the pinned magnetic layer by the leakage magnetic field form the hard bias layer can be solved.

What is claimed is:

1. A spin-valve magnetoresistive element comprising a free magnetic layer and a pinned magnetic layer via a non-magnetic electrically conductive layer, a first antiferromagnetic layer contacting with the pinned magnetic layer for fixing the magnetization direction of the pinned magnetic layer by a first exchange anisotropic magnetic field, and a second antiferromagnetic layer contacting with the free magnetic layer for aligning the magnetization of the free magnetic layer orthogonal to the magnetization direction of the pinned magnetic layer by a second exchange anisotropic magnetic field, wherein the first antiferromagnetic layer has a blocking temperature higher than that of the second antiferromagnetic layer, and the first exchange anisotropic magnetic field between the first antiferromagnetic layer and the pinned magnetic layer is larger than the second exchange anisotropic magnetic field between the second antiferromagnetic layer and the free magnetic layer.

2. The spin-valve magnetoresistive element according to claim 1, wherein the blocking temperature of the first antiferromagnetic layer is 300° C. or more, and the blocking temperature of the second antiferromagnetic layer is 100°0 C. to 280° C.

3. The spin-valve magnetoresistive element according to claim 1, wherein the first exchange anisotropic magnetic field between the first antiferromagnetic layer and the pinned magnetic layer is 200 Oe (oersted) or more, and the second exchange anisotropic magnetic field between the second antiferromagnetic layer and the free magnetic layer is 2 to 200 Oe.

4. The spin-valve magnetoresistive element according to claim 1, wherein the first antiferromagnetic layer is made from any of a Pt—Mn (platinum-manganese) alloy film, a Pt—Mn-X alloy (X represents at least one selected from the group consisting of Ni, Pd, Rh, Ru, Ir, and Cr), or an Ni—Mn (nickel-manganese) alloy film, and the second antiferromagnetic layer is made from any of an Ir—Mn (iridium-manganese) alloy film, an Rh—Mn (rhodium-manganese) alloy film, an Fe—Mn (iron-manganese) alloy film, or NiO (nickel oxide).

5. The spin-valve magnetoresistive element according to claim 1, wherein the first antiferromagnetic layer is made from a Pt—Mn alloy film with the composition ratio of 44 to 51 atomic % of Pt and 49 to 56 atomic % of Mn.

6. The spin-valve magnetoresistive element according to claim 1, wherein the first antiferromagnetic layer is made from any of a Pt—Mn (platinum-manganese) alloy film, a Pt—Mn-X alloy (X represents at least one selected from the group consisting of Ni, Pd, Rh, Ru, Ir, Cr, and Co), or an Ni—Mn (nickel-manganese) alloy film, and the second antiferromagnetic layer is made from any of an Ir—Mn (iridium-manganese) alloy film, an Rh—Mn (rhodium-manganese) alloy film, an Fe—Mn (iron-manganese) alloy film, or NiO (nickel oxide).

7. The spin-valve magnetoresistive element according to claim 4, wherein the first antiferromagnetic layer is made from a Pt—Mn alloy film with the composition ratio of 44 to 51 atomic % of Pt and 49 to 56 atomic % of Mn.

* * * * *

UNITED STATES PATENT AND TRADEMARK OFFICE
CERTIFICATE OF CORRECTION

PATENT NO. : 6,282,069 B1  
DATED : August 28, 2001  
INVENTOR(S) : Yukie Nakazawa et al.

Page 1 of 1

It is certified that error appears in the above-identified patent and that said Letters Patent is hereby corrected as shown below:

Claim 2,
Line 3, delete "300° C." and substitute -- 300° C -- in its place.
Line 4, delete "100°0" and substitute -- 100° --.
Line 5, delete "C. to" and substitute -- C to -- in its place.

Signed and Sealed this

Fifth Day of March, 2002

Attest:

Attesting Officer

JAMES E. ROGAN
*Director of the United States Patent and Trademark Office*